(12) United States Patent
Lee et al.

(10) Patent No.: US 10,551,244 B2
(45) Date of Patent: Feb. 4, 2020

(54) PHOTON DETECTOR

(71) Applicant: ELECTRONICS AND TELECOMMUNICATIONS RESEARCH INSTITUTE, Daejeon (KR)

(72) Inventors: Wook-Jae Lee, Seoul (KR); Jung Jin Ju, Daejeon (KR)

(73) Assignee: Electronics and Telecommunications Research Institute, Daejeon (KR)

(*) Notice: Subject to any disclaimer, the term of this patent is extended or adjusted under 35 U.S.C. 154(b) by 0 days.

(21) Appl. No.: 16/135,908

(22) Filed: Sep. 19, 2018

(65) Prior Publication Data

US 2019/0178709 A1 Jun. 13, 2019

(30) Foreign Application Priority Data

Dec. 7, 2017 (KR) .................. 10-2017-0167788

(51) Int. Cl.
| | |
|---|---|
| *G01J 1/04* | (2006.01) |
| *G02B 6/122* | (2006.01) |
| *G02B 6/12* | (2006.01) |
| *G01J 1/44* | (2006.01) |
| *G01J 1/42* | (2006.01) |
| *G01J 1/02* | (2006.01) |
| *B82Y 15/00* | (2011.01) |
| *H01L 39/10* | (2006.01) |
| *B82Y 20/00* | (2011.01) |
| *H01L 31/101* | (2006.01) |

(52) U.S. Cl.
CPC ........... *G01J 1/0407* (2013.01); *G01J 1/0209* (2013.01); *G01J 1/42* (2013.01); *G01J 1/44* (2013.01); *G02B 6/12004* (2013.01); *G02B 6/1226* (2013.01); *B82Y 15/00* (2013.01); *B82Y 20/00* (2013.01); *G01J 2001/442* (2013.01); *H01L 31/101* (2013.01); *H01L 39/10* (2013.01)

(58) Field of Classification Search
CPC ........ G01J 1/0407; G01J 1/44; G02B 6/12004
See application file for complete search history.

(56) References Cited

U.S. PATENT DOCUMENTS 6,812,464 B1 11/2004 Sobolewski et al.
8,212,235 B2* 7/2012 Wang .................... B82Y 20/00
257/12

(Continued)

OTHER PUBLICATIONS

Carlos Angulo Barrios, "Optical Slot-Waveguide Based Biochemical Sensors", Sensors, Jun. 16, 2009, 9, p. 4751-4765.

(Continued)

*Primary Examiner* — Hugh Maupin
(74) *Attorney, Agent, or Firm* — Rabin & Berdo, P.C.

(57) ABSTRACT

Provided is a photon detector. The photon detector includes an optical waveguide including input and detection regions, which are spaced apart from each other in a first direction, and a conversion region between the input region and the detection region, a nano pattern disposed on the optical waveguide in the conversion region, and a nanowire disposed on the optical waveguide in the detection region. The nano pattern includes a first pattern and a second pattern, which extend in the first direction, and the first pattern and the second pattern are spaced apart from each other in a second direction crossing the first direction.

19 Claims, 6 Drawing Sheets

(56) References Cited

U.S. PATENT DOCUMENTS

2008/0272302 A1* 11/2008 Frey .................. B82Y 20/00
                                                  250/336.2
2013/0051748 A1*  2/2013 Charbon ............ B82Y 20/00
                                                  385/131
2014/0299751 A1  10/2014 Tang et al.

OTHER PUBLICATIONS

Andreas Vetter et al., "Cavity-Enhanced and Ultrafast Superconducting Single-Photon Detectors", Nano Lett., Oct. 19, 2016, 16, p. 7085-7092.
W.H.P. Pernice et al., "High-speed and high-efficiency travelling wave single-photon detectors embedded in nanophotonic circuits", Nature Communications, 3, Dec. 27, 2012, p. 1-10.
Mohsen K. Akhlaghi et al., "Waveguide integrated superconducting single-photon detectors implemented as near-perfect absorbers of coherent radiation", Nature Communications, 6, Sep. 11, 2015, p. 1-8.

* cited by examiner

PHOTON DETECTOR

CROSS-REFERENCE TO RELATED APPLICATIONS

This U.S. non-provisional patent application claims priority under 35 U.S.C. § 119 of Korean Patent Application No. 10-2017-0167788, filed on Dec. 7, 2017, the entire contents of which are hereby incorporated by reference.

BACKGROUND

The present disclosure herein relates to a photon detector, and more particularly, to a photon detector including a nanowire.

Photon detectors are ultra-sensitive optical sensors capable of detecting even a single photon that is a minimum unit of light. Such photon detectors may be applied to quantum photonic integrated circuit fields. Researches to develop new photon detectors or to improve detection efficiency of detectors according to the related art is being actively carried out in universities, public research institutes, and industries since quantum photonic integrated circuits have attracted increasing in recent years.

Such photon detectors include an avalanche photodiode (APD)-based photon detector and a superconducting material-based photon detector. The superconducting material-based photon detector may have detection efficiency of about 80% or more in an optical communication wavelength range, have a simple structure, and be easy to be highly integrated.

SUMMARY

The present disclosure provides a photon detector having improved photon detection efficiency.

The object of the present disclosure is not limited to the aforesaid, but other objects not described herein will be clearly understood by those skilled in the art from descriptions below.

An embodiment of the inventive concept provides a photon detector including: an optical waveguide including input and detection regions, which are spaced apart from each other in a first direction, and a conversion region between the input region and the detection region; a nano pattern disposed on the optical waveguide in the conversion region; and a nanowire disposed on the optical waveguide in the detection region, wherein the nano pattern includes a first pattern and a second pattern, which extend in the first direction, and the first pattern and the second pattern are spaced apart from each other in a second direction crossing the first direction.

In an embodiment, the nano pattern may have one side adjacent to the detection region and the other side facing the one side, and each of the first pattern and the second pattern may have a uniform width from the one side to the other side.

In an embodiment, the first pattern and the second pattern may be disposed in parallel to each other.

In an embodiment, a distance between the first pattern and the second pattern may be less than a width of each of the first pattern and the second pattern.

In an embodiment, the nano pattern may include a metal and be optically coupled to the optical waveguide.

In an embodiment, the conversion region may be configured to convert light inputted into the input region of the optical waveguide into surface plasmon-polaritons. In an embodiment, the photon detector may further include a buffer layer between the optical waveguide and the nano pattern.

In an embodiment, the photon detector may further include a buffer layer between the optical waveguide and the nano pattern, wherein the buffer layer may include a material having a refractive index less than that of the optical waveguide.

In an embodiment, the buffer layer may directly contact the optical waveguide and the nano pattern.

In an embodiment, the nanowire may include a superconducting material.

In an embodiment, the photon detector may further include metal pads that cover both ends of the nanowire, respectively.

In an embodiment, the nanowire may include first portions, which extend in the first direction and are spaced apart from each other, and a second portion connecting the first portions to each other, and the second portion may be disposed adjacent to an end of the nano pattern.

In an embodiment, the optical waveguide may include a first protrusion protruding from one surface of the optical waveguide and a second protrusion protruding from the other surface facing the one surface, and the nanowire may extend from a top surface of the first protrusion to a top surface of the second protrusion.

In an embodiment, the nanowire may have a straight line shape.

In an embodiment, the optical waveguide may further include an extension region, and the extension region may extend from the detection region in a direction that is away from the conversion region.

In an embodiment, at least a portion of the nanowire may be disposed between the optical waveguide and the nano pattern.

In an embodiment, the nanowire may include first portions, which extend in the first direction and are spaced apart from each other, and a second portion connecting the first portions to each other, and at least a portion of the second portion may be disposed between the first pattern and the second pattern.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims. Like reference numerals refer to like elements throughout.

In the following description, the technical terms are used only for explaining a specific exemplary embodiment while not limiting the inventive concept. In this specification, the terms of a singular form may include plural forms unless specifically mentioned. The meaning of 'comprises' and/or 'comprising' specifies a component, a step, an operation and/or an element does not exclude other components, steps, operations and/or elements.

Additionally, the embodiment in the detailed description will be described with sectional views as ideal exemplary views of the present invention. In the figures, the dimensions of layers and regions are exaggerated for clarity of illustration. Accordingly, shapes of the exemplary views may be modified according to manufacturing techniques and/or allowable errors. Therefore, the embodiments of the present invention are not limited to the specific shape illustrated in the exemplary views, but may include other shapes that may be created according to manufacturing processes. For example, an etched region illustrated as a rectangle may be rounded or have a shape with a predetermined curvature. Areas exemplified in the drawings have general properties and are used to illustrate a specific shape of a device. Thus, this should not be construed as limited to the scope of the inventive concept.

Hereinafter, a photon detector according to embodiments of the inventive concept will be described with reference to the accompanying drawings.

Figure 1:
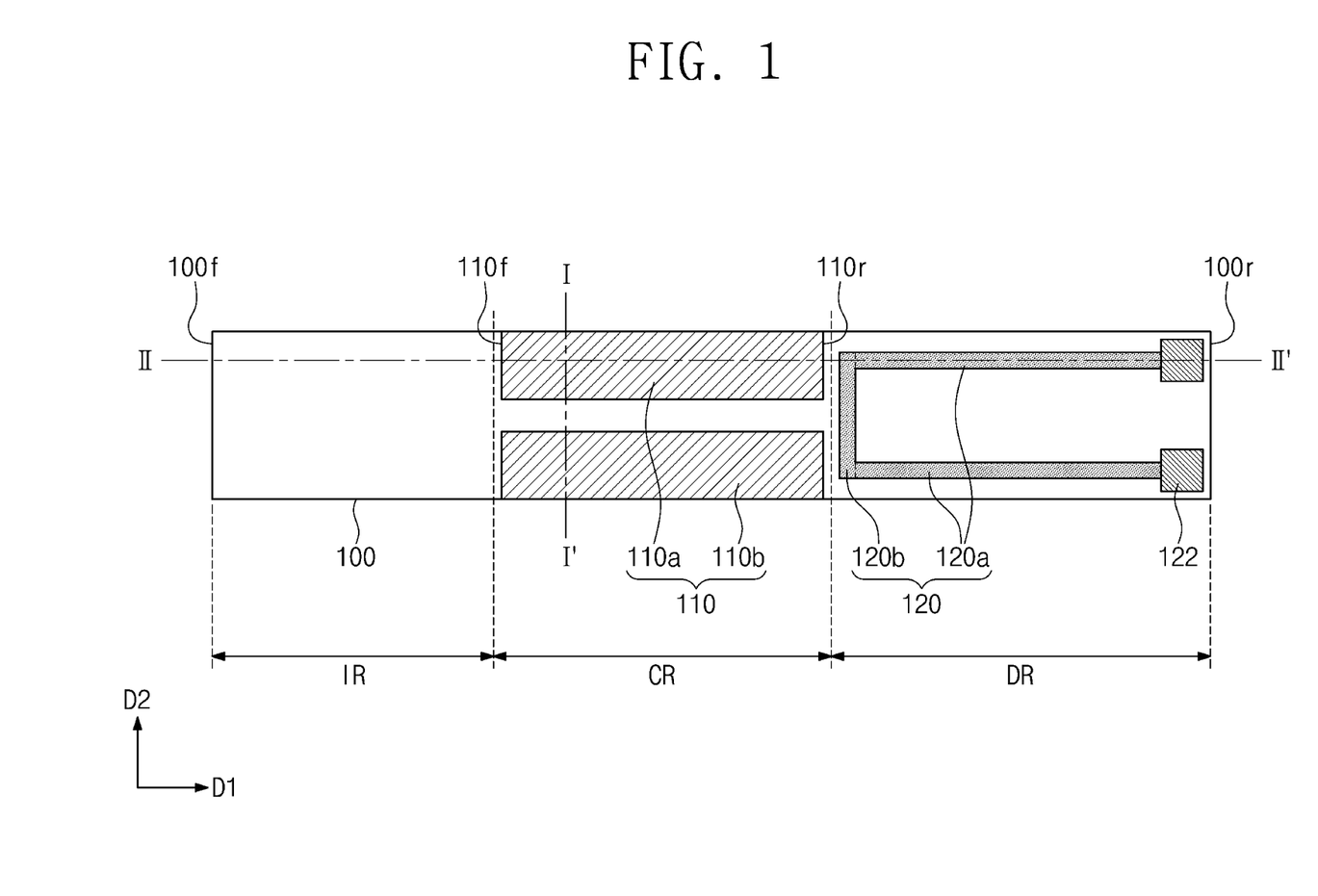
FIG. 1 is a plan view for explaining a photon detector according to embodiments of the inventive concept.
Figure 2:
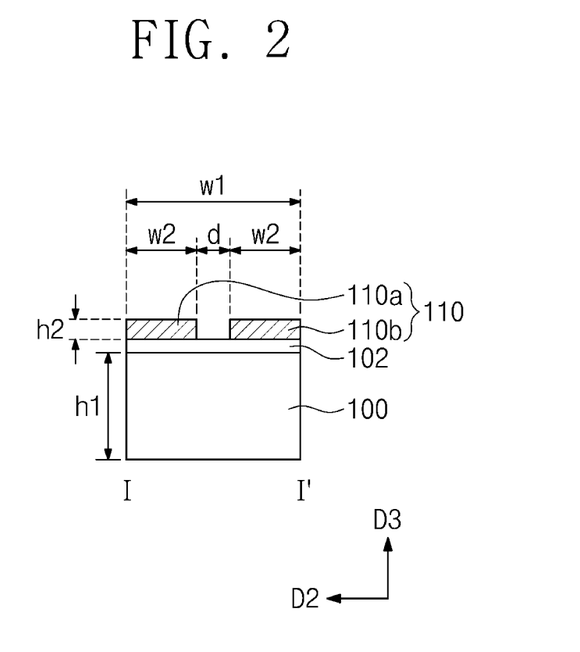
FIG. 2 is a cross-sectional view taken long line I-I' of FIG. 1.
Figure 3:
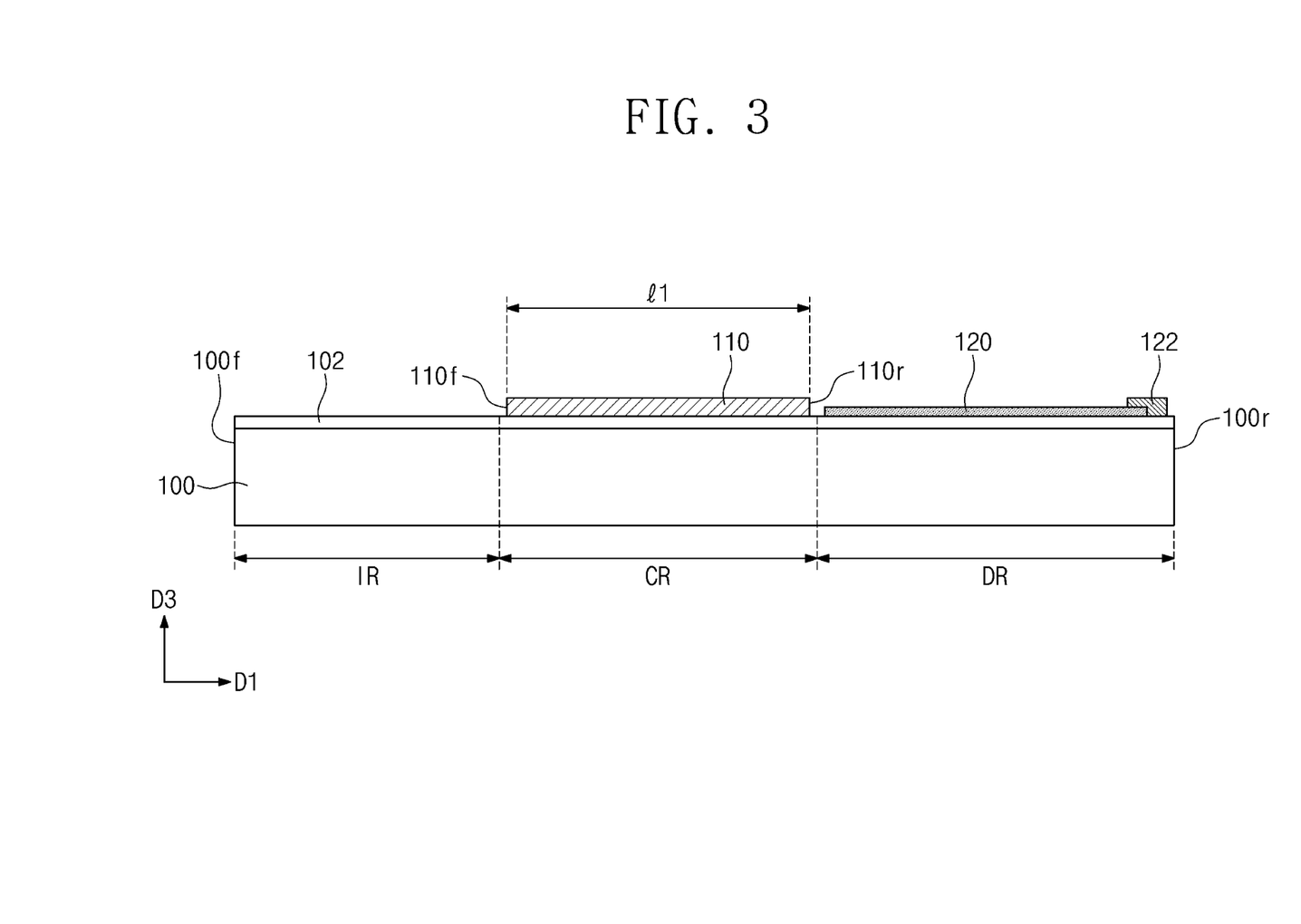
FIG. 3 is a cross-sectional view taken along line II-IF of FIG. 1.
Figure 4:
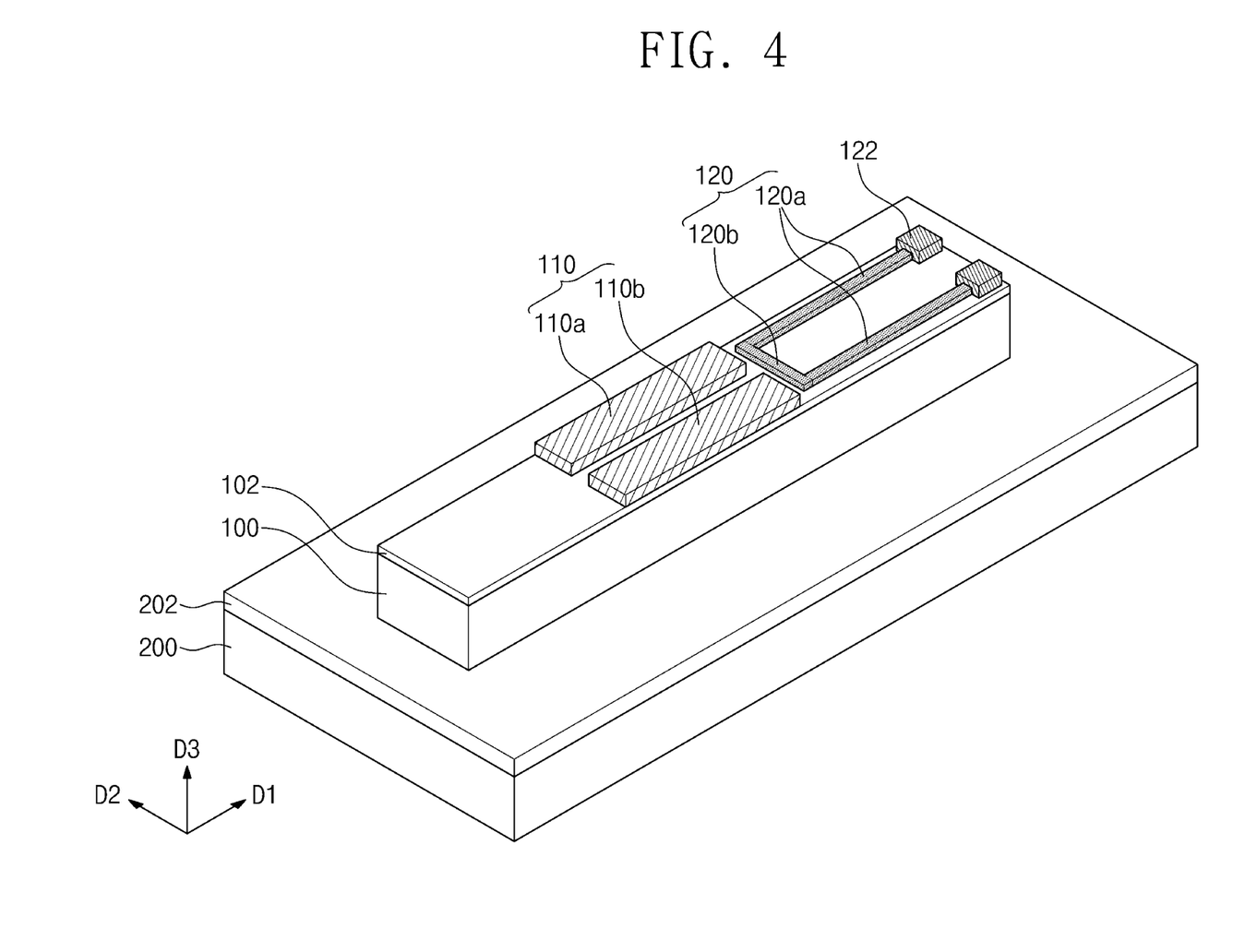
FIG. 4 is a perspective view for explaining a photon detector according to embodiments of the inventive concept.

FIG. 1 is a plan view for explaining a photon detector according to embodiments of the inventive concept. FIG. 2 is a cross-sectional view taken long line I-I' of FIG. 1. FIG. 3 is a cross-sectional view taken along line II-IF of FIG. 1. FIG. 4 is a perspective view for explaining a photon detector according to embodiments of the inventive concept.

Referring to FIGS. 1 to 3, a photon detector according to embodiments of the inventive concept may include an optical waveguide 100, a nano pattern 110, and a nanowire 120.

The optical waveguide 100 may extend in a first direction D1. The optical waveguide 100 may include an input region IR, a conversion region CR, and a detection region DR, which are arranged in the first direction D1. The conversion region CR may be disposed between the input region IR and the detection region DR. The optical waveguide 100 may transmit photons in the first direction D1. That is to say, the input region IR, the conversion region CR, and the detection region DR may be sequentially defined in a proceeding direction of the photons within the optical waveguide 100.

For example, the optical waveguide 100 may have a predetermined width W1 and a predetermined height h1 from a front surface 100f to a rear surface 100r of the optical waveguide 100. A material of the optical waveguide, which is transmitted through the inside of the optical waveguide 100 may be related to the material, the width w1, and the height h1 of the optical waveguide 100. The optical waveguide 100 may include silicon (Si). The optical waveguide 100 may have a width w1 of about 300 nm to about 700 nm. The optical waveguide 100 may have a height h1 of about 150 nm to about 300 nm. Thus, the optical waveguide 100 may transmit light having a wavelength band that is used for optical communication. For example, the optical waveguide 100 may be configured to transmit light having a wavelength of about 500 nm to about 1.7 µm.

The input region IR of the optical waveguide 100 may be a region for receiving the photons from the outside. For example, the front surface 100f of the optical waveguide 100 may have a rectangular shape that is similar to that illustrated in FIG. 2. The front surface 100f of the optical waveguide may be flat. For example, an optical circuit or an optical device may be coupled to the front surface 100f of the optical waveguide. The optical waveguide may be butt-coupled to the optical circuit or the optical device or may be optically coupled to the optical circuit or the optical device through an optical fiber. That is, the input region IR of the optical waveguide 100 may be configured to receive the photons from the optical circuit or the optical device outside the photon detector.

The nano pattern 110 may be disposed on the optical waveguide 100 in the conversion region CR. The nano pattern 110 may extend in the first direction D1 along a top surface of the optical waveguide 100. The nano pattern 110 may have the form of a thin film. For example, the nano pattern 110 may have a thickness h2 of about 10 nm to about 50 nm. The nano pattern 110 may have a rectangular shape having a slit that crosses the nano pattern 110 from a plan viewpoint. The nano pattern 110 may expose the optical waveguide 100 through the slit.

In more detail, the nano pattern 110 may include a first pattern 110a and a second pattern 110b. Each of the first pattern 110a and the second pattern 110b may extend in the first direction D1. The first pattern 110a and the second pattern 110b may be spaced apart from each other in a second direction D2 crossing the first direction D1. Each of the first pattern 110a and the second pattern 110b may have a uniform width w2 from an end 110f of the nano pattern 110 to the other end 110r of the nano pattern 110. A distance d between the first pattern 110a and the second pattern 110b may be less than the width w2 of each of the first pattern 110a and the second pattern 110b. For example, each of the first pattern 110a and the second pattern 110b may have a width w2 of about 20 nm to about 350 nm. For example, a distance D between the first pattern 110a and the second pattern 110b may range from about 10 nm to about 100 nm. The nano pattern 110 may include a metal. For example, the nano pattern 110 may include a metal in which a real part of an optical constant has a negative value, and an imaginary part has a small value. For example, the nano pattern 110 may include gold (Au), silver (Ag), copper (Cu), and aluminum (Al).

The nano pattern 110 may be optically coupled to the optical waveguide 100. That is to say, the photons inputted into the input region IR of the optical waveguide 100 may be transmitted to the nano pattern 110. The nano pattern 110 may convert the photons inputted into the input region IR of the optical waveguide 100 into surface plasmon-polaritons (SPP). The SPP may be defined as collective oscillation of a free electron gas that propagates along an interface of a material having a negative dielectric function and a material having a positive dielectric function. The nano pattern 110 may concentrate the plasmon-polaritons between the first pattern 110a and the second pattern 110b. The nano pattern 110 may have an adequate length I to convert the photons inputted into the input region IR into the plasmon-polaritons. The nano pattern 110 may have a length I of about 100 nm to about 10 μm.

The nanowire 120 may be disposed on the detection region DR of the optical waveguide 100. The nanowire 120 may be disposed to be adjacent to the nano pattern 110 or to overlap the nano pattern 110. The nanowire 120 may have a diameter of about 5 nm to about 40 nm. According to an embodiment, the nanowire 120 may have a U shape. However, the embodiment of the inventive concept is not limited thereto. The nanowire 120 may have an M shape or a straight line shape. In this embodiment, the nanowire 120 having the U shape will be described.

Particularly, the nanowire 120 may include first portions 120a and a second portion 120b. The first portions 120a may extend in the first direction D1. The first portions 120a may be spaced apart from each other in the second direction. The first portions 120a may be disposed in parallel to each other. The second portion 120b may connect the first portions 120a to each other. For example, the second portion 120b may connect ends of the first portions 120a, which are adjacent to the nano pattern 110, to each other. The second portion 120b may be disposed adjacent to the rear surface 100r of the nano pattern 110.

The nanowire 120 may include a superconducting material. The nanowire may include, for example, niobium nitride (NbN), niobium tin ($Nb_3Sn$), niobium germanium ($Nb_3Ge$), niobium titanium (NbTi), magnesium boride ($MgB_2$), yttrium barium copper oxide (YBCO), and niobium titanium nitride (NbTiN). In addition, the nanowire 120 may include, for example, a compound of lanthanum (La), barium (Ba), copper (Cu), and oxygen (O). The nanowire 120 may be maintained in a superconducting state for the photon detection. For example, the photon detector may be provided in a cooling chamber (not shown). The inside of the cooling chamber may be maintained at a temperature that is less than a critical temperature at which the nanowire 120 is achieved in superconducting state. The nanowire 120 that is in the superconducting state may absorb photons or plasmon-polaritons outputted from the other end 110r of the nano pattern, and thus, the superconducting state may be locally broken. That is, the nanowire that absorbs the photons or surface plasmon-polaritons may temporarily increase in resistance.

For example, the photon detector may include metal pads 122 for electrically connecting the nanowire 120 to an external device. The metal pads 122 may cover both ends of the nanowire 120, respectively. For example, the metal pads 122 may include copper (Cu).

For example, a buffer layer 102 may be disposed between the optical waveguide 100 and the nano pattern 110. The buffer layer 102 may conformally cover a top surface of the optical waveguide 100 in the conversion region CR. The buffer layer 102 may directly contact the optical waveguide 100 and the nano pattern 110. The buffer layer 102 may include a material having a refractive index less than that of the optical waveguide 100. For example, the buffer layer 102 may include silicon oxide ($SiO_2$) and silicon nitride ($Si_3N_4$). The buffer layer 102 may facilitate the optical coupling between the optical waveguide 100 and the nano pattern 110. Also, the buffer layer 102 may help light to be converted into the surface plasmon-polaritons on the interface between the optical waveguide 100 and the nano pattern 110. For example, the buffer layer 102 may extend from the top surface of the optical waveguide 100 of the input region IR to the top surface of the optical waveguide of the detection region DR. For example, the buffer layer 102 may cover the entire top surface of the optical waveguide 100. In the detection region DR, the buffer layer 102 may be disposed between the nanowire 120 and the optical waveguide 100.

For example, as illustrated in FIG. 4, the optical waveguide 100 may be a ridge waveguide. On the other hand, the photon detector may further include a substrate 200 and an insulation layer 202. The optical waveguide 100 may be disposed on the substrate 200 and the insulation layer 202, which are sequentially laminated. The substrate 200 may be a semiconductor substrate. For example, the substrate 200 may include an insulator. The insulation layer 202 may include a material having a refractive index less than that of the substrate 200. The substrate 200 and the insulation layer 202 may provide a planar surface extending in the first direction D1 and the second direction D2 crossing the first direction D1. The optical waveguide may be provided on the planar surface of the substrate 200 and the insulation layer 202.

Referring again to FIGS. 1 to 3, an operation method of the above-described photon detector will be described in more detail. The input region IR of the optical waveguide 100 may receive photons from the outside. The received photons may proceed to the conversion region CR along the direction in which the optical waveguide 100 extends. The photons may proceed to a waveguide mode in the input region IR of the optical waveguide 100.

The photons in the waveguide mode may be converted into the surface plasmon-polaritons in the conversion region CR. Particularly, the photons in the waveguide mode may be coupled to the nano pattern 110 within the conversion region CR. Since the photons coupled to the nano pattern 110 in the waveguide mode proceed in the first direction D1 within the conversion region CR, free electrons within the nano pattern 110 may oscillate to generate the surface plasmon-polaritons. The surface plasmon-polaritons may have an intensity of several tens to several hundreds of electromagnetic waves when compared with the light intensity in the waveguide mode. Also, the surface plasmon-polaritons may be concentrated into a small area when compared with the light in the waveguide mode. For example, the surface plasmon-polaritons may be concentrated between the first pattern 110a and the second pattern 110b of the nano pattern 110. The surface plasmon-polaritons may be outputted to the rear surface 110r of the nano pattern 110.

The nanowire 120 that is provided in the superconducting state may absorb the surface plasmon-polaritons outputted from the rear surface 110r of the nano pattern 110 to vary in resistance. A superconductor maintains the superconducting state only when an amount of current carried by the superconductor, a temperature of the superconductor, and external electric fields surrounding the superconductor remain below a predetermined value that is referred to as a threshold value. The nanowire 120 that is in the superconducting state may receive the photons and/or the surface plasmon-polaritons from the optical waveguide 100 and the nano pattern 110 and then be changed from the superconducting state into a state having some resistance. A variation in resistance between both ends of the nanowire 120 may be measured by an external device (not shown) connected to the metal pads 122.

The conversion region CR and the nano pattern 110 within the conversion region CR may be configured to convert the photons into the surface plasmon-polaritons, thereby improving detection efficiency of the photons. In addition, since the nano pattern is provided to shorten a length of the nanowire 120, an inductance of the nanowire 120 may be reduced to increase in detection rate of the photons.

Figure 5:
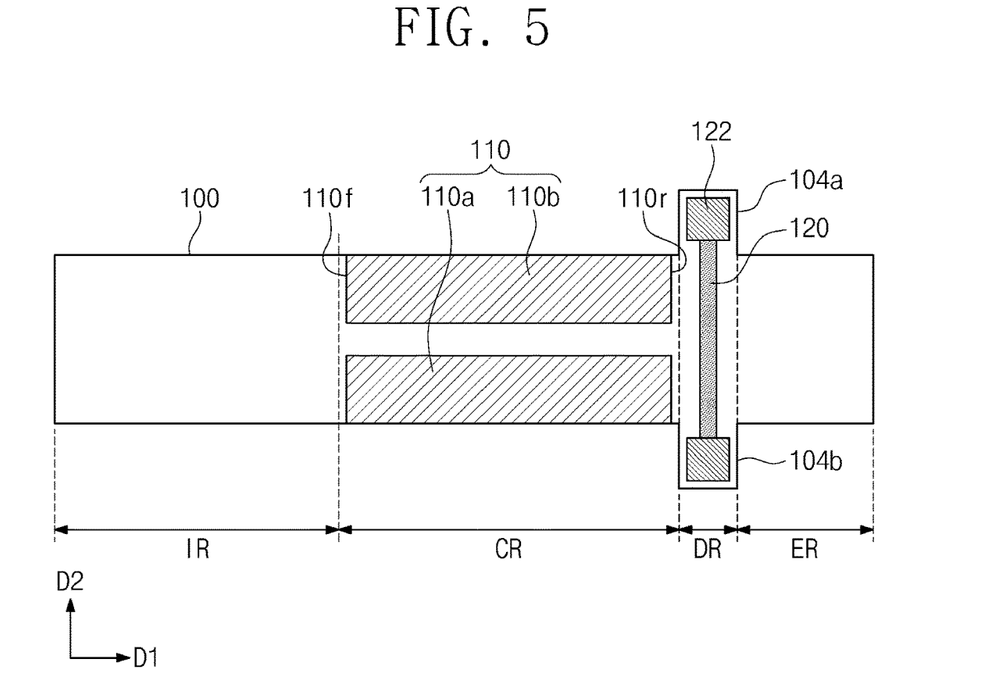
FIG. 5 is a plan view for explaining a photon detector according to embodiments of the inventive concept.

FIG. 5 is a plan view for explaining the photon detector according to embodiments of the inventive concept. For the simplicity of description, description with respect to duplicated constituents will be omitted.

Referring to FIG. 5, the optical waveguide 100 may include a first protrusion 104a and a second protrusion 104b. The first protrusion 104a may protrude from one surface of the optical waveguide 100 in the detection region DR. The second protrusion 104b may protrude from the other surface of the optical waveguide 100 in the detection region DR. That is to say, the detection region DR may have a shape that extends in the second direction D2. Thus, the photon detector may have a relatively short length in the first direction D1.

The nanowire 120 may extend from a top surface of the first protrusion 104a to a top surface of the second protrusion 104b. The nanowire 120 may have a straight line shape that extends in the second direction D2. Since the ends of the nanowire 120 are disposed on the protrusions, the metal pads 122 may also be disposed on the first protrusion 104a and the second protrusion 104b.

The optical waveguide may further include an extension region ER defined in a rear end of the detection region DR. Since the extension region ER is defined in the rear end of the detection region DR, noise due to signal reflection at the end of the photon detector may be reduced. Particularly, the extension region ER may be spaced apart from the conversion region CR with the detection region DR therebetween. The extension region ER may extend in a direction (i.e., the first direction D1) that is away from the detection region DR. A width of the extension region ER in the second direction D2 may be the same as a width of each of the input region IR and the conversion region DR in the second direction D2.

Figure 6:
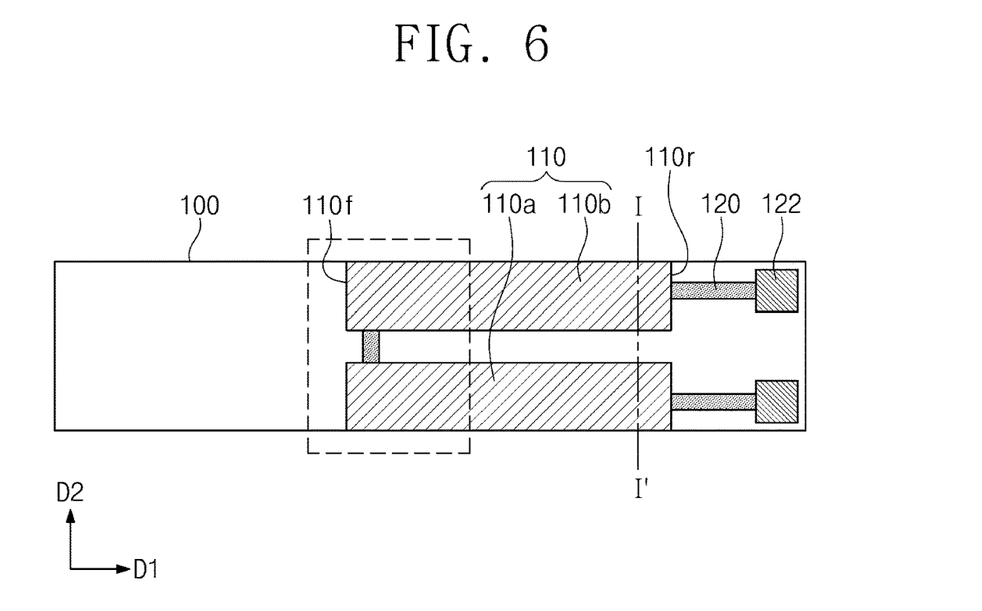
FIG. 6 is a plan view for explaining a photon detector according to embodiments of the inventive concept.
Figure 7:
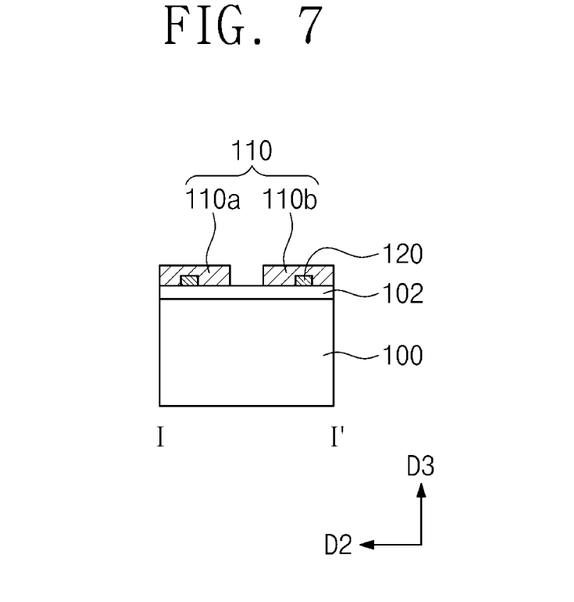
FIG. 7 is a cross-sectional view taken along line of FIG. 6.
Figure 8:
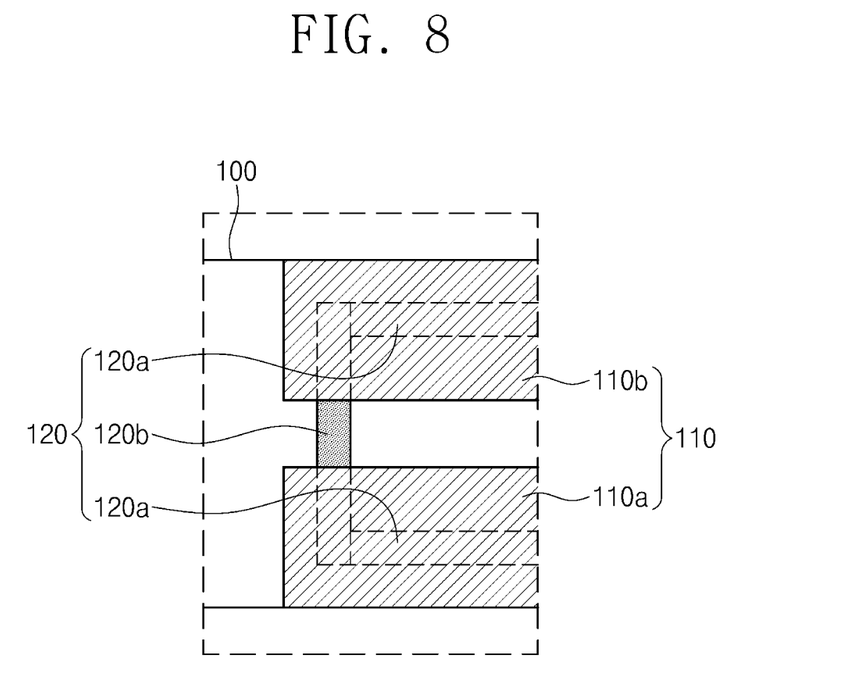
FIG. 8 is an enlarged view of a portion A of FIG. 6.

FIG. 6 is a plan view for explaining the photon detector according to embodiments of the inventive concept. FIG. 7 is a cross-sectional view taken along line of FIG. 6. FIG. 8 is an enlarged view of a portion A of FIG. 6. For the simplicity of description, description with respect to duplicated constituents will be omitted.

Referring to FIGS. 6 to 8, a portion of the nanowire 120 may be disposed between the optical waveguide 100 and the nano pattern 110. On the other hand, the nanowire 120 and the nano pattern 110 may vertically overlap each other.

Particularly, the first portions 120a of the nanowire 120 may extend in one direction and then be inserted into the nano pattern 110. The nanowire 120 may be inserted into the other end 110r of the nano pattern 110, and thus, a portion of the nanowire 120 may be disposed in the nano pattern 110. The second portion 120b of the nanowire 120 may extend from the inside of the first pattern 110a of the nano pattern 110 to the inside of the second pattern 110b. At least a portion of the second portion 120b of the nanowire 120 may be disposed between the first pattern 110a and the second pattern 110b. That is, at least a portion of the second portion 120b of the nanowire 120 may be exposed by the first pattern 110a and the second pattern 110b. Since the nanowire 120 and the nano pattern 110 vertically overlap each other, the photon detector may be reduced in length in the first direction D1.

According to the embodiments of the inventive concept, the photon detector, which is easily manufactured, improved in photon detection efficiency, and has superior photon detection rate, may be provided.

Although the embodiment of the inventive concept is described with reference to the accompanying drawings, those with ordinary skill in the technical field of the inventive concept pertains will be understood that the present disclosure can be carried out in other specific forms without changing the technical idea or essential features. Thus, the above-disclosed embodiments are to be considered illustrative and not restrictive.

What is claimed is:

1. A photon detector comprising:
    an optical waveguide comprising input and detection regions, which are spaced apart from each other in a first direction, and a conversion region between the input region and the detection region;
    a nano pattern disposed on the optical waveguide in the conversion region; and
    a nanowire disposed on the optical waveguide in the detection region,
    wherein the nano pattern comprises a first pattern and a second pattern, which extend in the first direction,
    the first pattern and the second pattern are spaced apart from each other in a second direction crossing the first direction,
    a distance between the first pattern and the second pattern is less than a width, in the second direction, of each of the first pattern and the second pattern,
    the nanowire comprises first portions, which extend in the first direction and are spaced apart from each other, and a second portion connecting the first portions to each other, and
    the first portions are at least partially covered by the first pattern and the second pattern in a plan view, and
    the second portion extends between the first pattern and the second pattern in the plan view such that the second portion is at least partially exposed in a space between the first pattern and the second pattern.

2. The photon detector of claim 1, wherein the nano pattern has one side adjacent to the detection region and the other side facing the one side, and
    each of the first pattern and the second pattern has a uniform width from the one side to the other side.

3. The photon detector of claim 1, wherein the first pattern and the second pattern are disposed in parallel to each other.

4. The photon detector of claim 1, wherein the nano pattern comprises a metal and is optically coupled to the optical waveguide.

5. The photon detector of claim 4, wherein the conversion region is configured to convert light inputted into the input region of the optical waveguide into surface plasmon-polaritons.

6. The photon detector of claim 1, further comprising a buffer layer between the optical waveguide and the nano pattern,
    wherein the buffer layer comprises a material having a refractive index less than that of the optical waveguide.

7. The photon detector of claim 6, wherein the buffer layer directly contacts the optical waveguide and the nano pattern.

8. The photon detector of claim 1, wherein the nanowire comprises a superconducting material.

9. The photon detector of claim 1, further comprising metal pads that cover both ends of the nanowire, respectively.

10. The photon detector of claim 1, wherein
    the second portion is disposed adjacent to an end of the nano pattern.

11. The photon detector of claim 10, wherein the first portion of the nanowire extends in the second direction.

12. The photon detector of claim 1, wherein the optical waveguide comprises a first protrusion protruding from one surface of the optical waveguide and a second protrusion protruding from the other surface facing the one surface, and
the nanowire extends from a top surface of the first protrusion to a top surface of the second protrusion.

13. The photon detector of claim 12, wherein the nanowire has a straight line shape.

14. The photon detector of claim 12, wherein the optical waveguide further comprises an extension region, and
the extension region extends from the detection region in a direction that is away from the conversion region.

15. The photon detector of claim 1, wherein at least a portion of the nanowire is disposed between the optical waveguide and the nano pattern.

16. The photon detector of claim 15, wherein the nanowire comprises first portions, which extend in the first direction and are spaced apart from each other, and a second portion connecting the first portions to each other, and
at least a portion of the second portion is disposed between the first pattern and the second pattern.

17. The photon detector of claim 1, further comprising a buffer layer on the waveguide and extending contiguously on the waveguide over the input region, over the conversion region, and over the detection region, the buffer layer located between the waveguide and the nano pattern and between the waveguide and the nanowire, and
wherein the buffer layer has a refractive index less than a refractive index of the waveguide.

18. The photon detector of claim 1, the first pattern and the second pattern each have a width less than 50 nm.

19. The photon detector of claim 1, wherein a surface of the waveguide on which the nano pattern is disposed is flat and co-planar with a surface of the waveguide on which the nanowire is disposed.

* * * * *